United States Patent
Kalsani et al.

(10) Patent No.: US 12,520,495 B2
(45) Date of Patent: Jan. 6, 2026

(54) 3D NAND WITH IO CONTACTS IN ISOLATION TRENCH

(71) Applicant: INTEL NDTM US LLC, Santa Clara, CA (US)

(72) Inventors: Praveen Kumar Kalsani, San Jose, CA (US); Ahmed Reza, San Jose, CA (US); Liu Liu, Dalian (CN); Deepak Thimmegowda, Fremont, CA (US); Zengtao Tony Liu, Eagle, ID (US); Sriram Balasubrahmanyam, Folsom, CA (US)

(73) Assignee: Intel NDTM US LLC, Santa Clara, CA (US)

( * ) Notice: Subject to any disclaimer, the term of this patent is extended or adjusted under 35 U.S.C. 154(b) by 892 days.

(21) Appl. No.: 17/469,634

(22) Filed: Sep. 8, 2021

(65) Prior Publication Data

US 2023/0076831 A1  Mar. 9, 2023

(51) Int. Cl.
| | |
|---|---|
| *H10B 43/50* | (2023.01) |
| *H10B 41/27* | (2023.01) |
| *H10B 41/50* | (2023.01) |
| *H10B 43/27* | (2023.01) |

(52) U.S. Cl.
CPC ............ *H10B 43/50* (2023.02); *H10B 41/27* (2023.02); *H10B 41/50* (2023.02); *H10B 43/27* (2023.02)

(58) Field of Classification Search
CPC ........ H10B 41/10; H10B 43/10; H10B 41/40; H10B 43/40; H10B 41/50; H10B 43/50; H10B 41/27; H10B 43/27
See application file for complete search history.

(56) References Cited

U.S. PATENT DOCUMENTS

| | | | | |
|---|---|---|---|---|
| 7,851,851 | B2 * | 12/2010 | Mokhlesi | H10B 41/27 |
| | | | | 257/326 |
| 9,559,117 | B2 * | 1/2017 | Pachamuthu | H01L 21/76889 |
| 10,256,245 | B2 * | 4/2019 | Ariyoshi | H01L 23/5226 |
| 2015/0318298 | A1 * | 11/2015 | Matsudaira | H01L 21/31111 |
| | | | | 257/314 |
| 2017/0179153 | A1 * | 6/2017 | Ogawa | H10B 41/27 |

(Continued)

FOREIGN PATENT DOCUMENTS

| | | | | |
|---|---|---|---|---|
| CN | 111276486 | A * | 6/2020 | ......... G11C 16/0483 |
| EP | 3910673 | A1 * | 11/2021 | ........... H10D 64/693 |
| KR | 20200078752 | | 7/2020 | |

OTHER PUBLICATIONS

Khakifirooz, A., et al. "A 1Tb 4b/Cell 144-Tier Floating-Gate 3D-Nand Flash Memory with 40 MB/s Program Throughput and 13.8 GB/mm Bit Density", IEEE International Solid-State Circuits Conference (ISSCC 2021); Session 30; Non-Volatile Memories; 30.2; Feb. 18, 2021.

(Continued)

*Primary Examiner* — Mohammed Shamsuzzaman
(74) *Attorney, Agent, or Firm* — Morgan, Lewis & Bockius LLP

(57) ABSTRACT

An embodiment of a memory device may include a substrate, a first memory array of three-dimensional (3D) NAND cells disposed on the substrate, an isolation trench disposed on the substrate adjacent to the first memory array, and an input/output (IO) contact positioned within the isolation trench. Other embodiments are disclosed and claimed.

14 Claims, 6 Drawing Sheets

(56) References Cited

U.S. PATENT DOCUMENTS

| | | | |
|---|---|---|---|
| 2017/0330876 A1* | 11/2017 | Leedy | H10D 30/023 |
| 2020/0144242 A1 | 5/2020 | Park | |
| 2020/0203329 A1* | 6/2020 | Kanamori | H10D 88/00 |
| 2020/0402579 A1 | 12/2020 | Park | |
| 2021/0005629 A1* | 1/2021 | Lim | G11C 7/18 |
| 2021/0066320 A1 | 3/2021 | Kim et al. | |

OTHER PUBLICATIONS

Extended European Search Report for European Patent Application No. 22185083.7, dated Jan. 3, 2023.

* cited by examiner

3D NAND WITH IO CONTACTS IN ISOLATION TRENCH

BACKGROUND

A typical flash memory device may include a memory array that includes a large number of non-volatile memory cells arranged in row and column fashion. In recent years, vertical memory, such as three-dimensional (3D) memory, has been developed in various forms, such as NAND, cross-point, or the like. A 3D flash memory array may include a plurality of memory cells stacked over one another to form a vertical NAND string. With an increased number of tiers in 3D NAND, and increased block size, the minimum data unit that can be erased at once also increases. To reduce the block size, some 3D NAND memory devices may utilize a block-by-deck (BBD) architecture. In an example BBD architecture, the tiers are divided into 3 decks, with 48 write-lines (WLs) in each deck, and the block size is reduced from 144 MB to 48 MB. Decks can be assigned to any combination of quad-level cell (QLC) or single-level cell (SLC) blocks.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
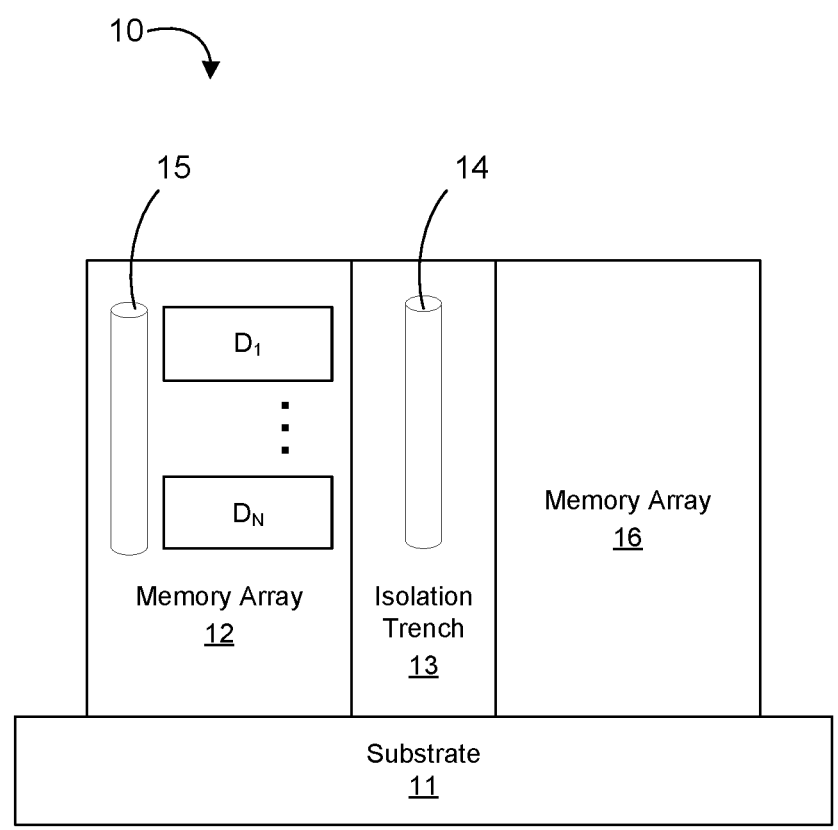
FIG. 1 is a block diagram, side view of an example of a memory device according to an embodiment.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

While the following description sets forth various implementations that may be manifested in architectures such as system-on-a-chip (SoC) architectures for example, implementation of the techniques and/or arrangements described herein are not restricted to particular architectures and/or computing systems and may be implemented by any architecture and/or computing system for similar purposes. For instance, various architectures employing, for example, multiple integrated circuit (IC) chips and/or packages, and/or various computing devices and/or consumer electronic (CE) devices such as set top boxes, smartphones, etc., may implement the techniques and/or arrangements described herein. Further, while the following description may set forth numerous specific details such as logic implementations, types and interrelationships of system components, logic partitioning/integration choices, etc., claimed subject matter may be practiced without such specific details. In other instances, some material such as, for example, control structures and full software instruction sequences, may not be shown in detail in order not to obscure the material disclosed herein.

The material disclosed herein may be implemented in hardware, Field Programmable Gate Array (FPGA), firmware, driver, software, or any combination thereof. The material disclosed herein may also be implemented as instructions stored on a machine-readable medium, which may be read and executed by Moore Machine, Mealy Machine, and/or one or more processors. A machine-readable medium may include any medium and/or mechanism for storing or transmitting information in a form readable by a machine (e.g., a computing device). For example, a machine-readable medium may include read only memory (ROM); random access memory (RAM); Dynamic random-access memory (DRAM), magnetic disk storage media; optical storage media; NV memory devices; phase-change memory, qubit solid-state quantum memory, electrical, optical, acoustical or other forms of propagated signals (e.g., carrier waves, infrared signals, digital signals, etc.), and others.

References in the specification to "one implementation", "an implementation", "an example implementation", etc., indicate that the implementation described may include a particular feature, structure, or characteristic, but every embodiment may not necessarily include the particular feature, structure, or characteristic. Moreover, such phrases are not necessarily referring to the same implementation. Further, when a particular feature, structure, or characteristic is described in connection with an embodiment, it is submitted that it is within the knowledge of one skilled in the art to effect such feature, structure, or characteristic in connection with other implementations whether or not explicitly described herein.

NV memory (NVM) may be a storage medium that does not require power to maintain the state of data stored by the medium. In one embodiment, the memory device may include a three-dimensional (3D) NAND device. The memory device may refer to the die itself and/or to a packaged memory product. In particular embodiments, a memory component with non-volatile memory may comply with one or more standards promulgated by the JEDEC™, or other suitable standard (the JEDEC™ standards cited herein are available at jedec.org).

With reference to FIG. 1, an embodiment of a memory device 10 may include a substrate 11, a first memory array 12 of three-dimensional (3D) NAND cells disposed on the substrate 11, an isolation trench 13 disposed on the substrate 11 adjacent to the first memory array 12, and an input/output (IO) contact 14 positioned within the isolation trench 13 (examples of which are described in further detail below). In some embodiments, the first memory array 12 may comprise a plurality of decks $D_1$ to $D_N$ (N>1), and the IO contact 14 may span at least two decks of the plurality of decks $D_1$ to $D_N$. The memory device 10 may also include a non-IO contact 15 that spans at least two decks of the plurality of decks $D_1$ to $D_N$ disposed in an area of the first memory array 12. In some embodiments, the isolation trench 13 may completely surround the first memory array 12 (e.g., an isolation ring). Some embodiments of the memory device 10 may further include other circuitry on another side of the isolation trench 13 (e.g., relative to the first memory array 12). For example, the memory device 10 may further include a second memory array 16 of 3D NAND cells disposed on the substrate 11, with the isolation trench disposed between the first memory array 12 and the second memory array 16. In any of the embodiments herein, the first memory array 12 (e.g., and/or the second memory array 16) may comprise an array of a vertical 3D NAND strings of memory cells, and the memory cells may comprise one of floating gate NAND memory cells, charge trap flash (CTF) NAND memory cells, and isolated CTF NAND memory cells.

Figure 2:
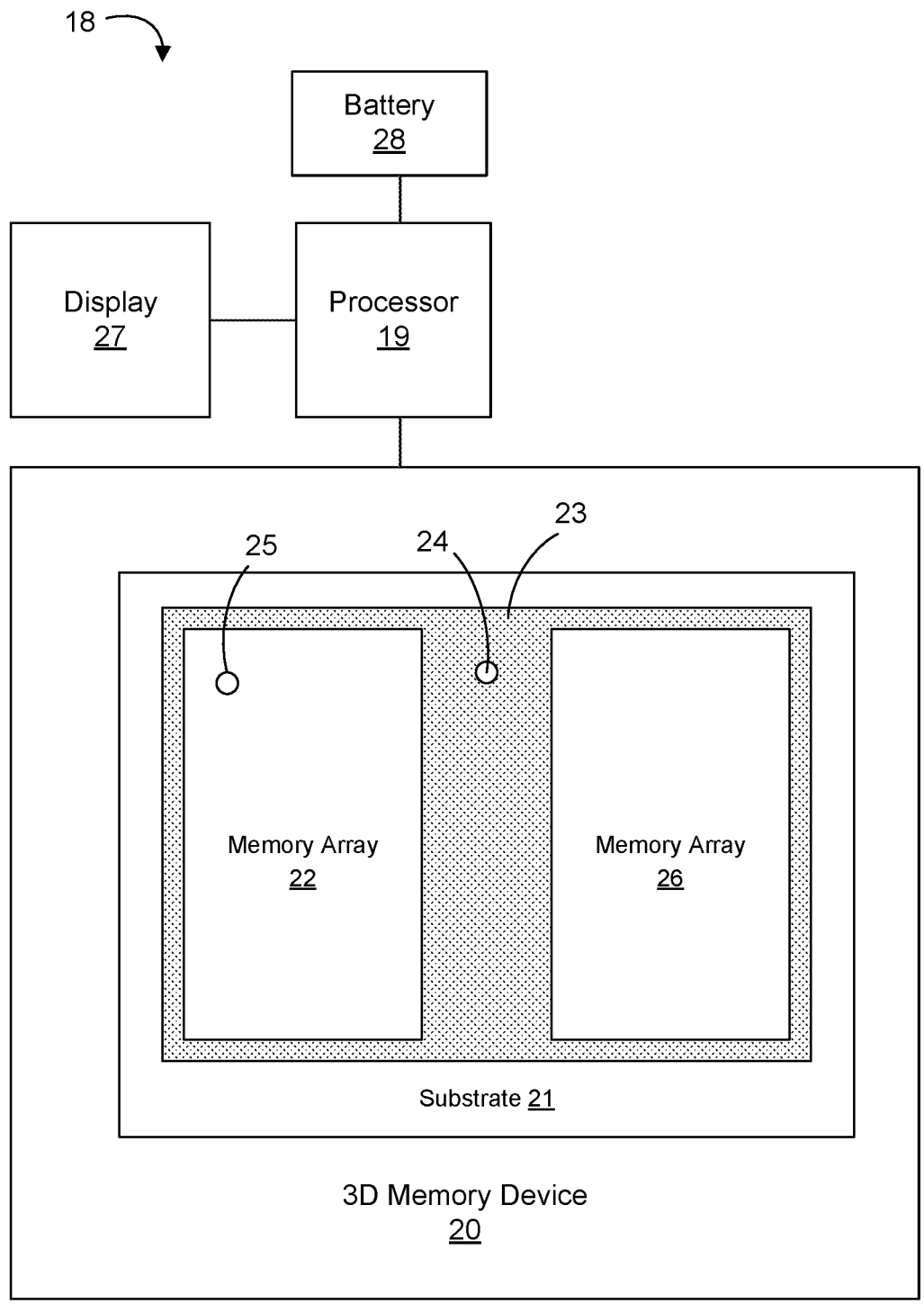
FIG. 2 is a block diagram, top view of an example of a system according to an embodiment.

With reference to FIG. 2, an embodiment of a system 18 may include a processor 19, and a 3D memory device 20 coupled with the processor 19. The 3D memory device 20 may include a substrate 21, a first memory array 22 of 3D NAND cells disposed on the substrate 21, an isolation trench 23 disposed on the substrate 21 adjacent to the first memory array 22, and an IO contact 24 positioned within the isolation trench 23. In some embodiments, the first memory array 22 may comprise a plurality of decks and the IO contact 24 spans at least two decks of the plurality of decks. The 3D memory device 20 may further include a non-IO contact 25 that spans at least two decks of the plurality of decks disposed in an area of the first memory array 22.

As illustrated in FIG. 2, the isolation trench 23 completely surrounds the first memory array 22. The 3D memory device 20 may further include a second memory array 26 of 3D NAND cells disposed on the substrate 21, wherein the isolation trench 23 is disposed between the first memory array 22 and the second memory array 26. For example, the first memory array 22 may comprise an array of a vertical 3D NAND strings of memory cells, and the memory cells may comprise one of floating gate NAND memory cells, CTF NAND memory cells, and isolated CTF NAND memory cells. In some embodiments, the system 18 may comprise a mobile computing device and may include any of a number of connected devices, peripherals, and/or components, such as at least one of a display 27 communicatively coupled to the processor 19, or a battery 28 coupled to the processor 19, etc.

Figure 3:
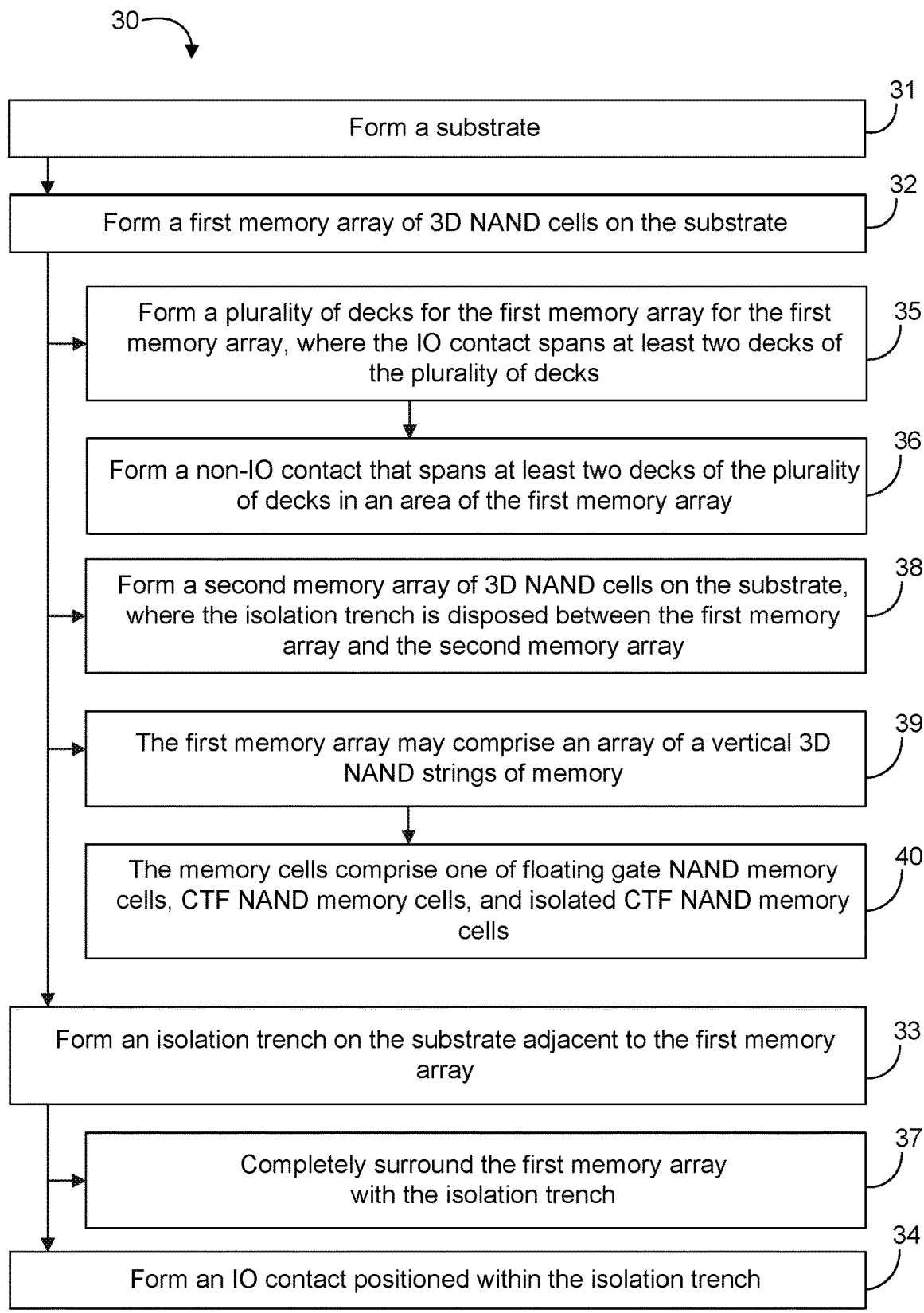
FIG. 3 is a flowchart of an example of a method according to an embodiment.

With reference to FIG. 3, an embodiment of a method 30 to manufacture a memory device may include forming a substrate at box 31, forming a first memory array of 3D NAND cells on the substrate at box 32, forming an isolation trench on the substrate adjacent to the first memory array at box 33, and forming an IO contact positioned within the isolation trench at box 34. In some embodiments, forming the first memory array may comprise forming a plurality of decks for the first memory array at box 35, where the IO contact spans at least two decks of the plurality of decks. Some embodiments of the method 30 may further include forming a non-IO contact that spans at least two decks of the plurality of decks in an area of the first memory array at box 36.

Some embodiments of the method 30 may also include completely surrounding the first memory array with the isolation trench at box 37. For example, the method 30 may include forming a second memory array of 3D NAND cells on the substrate at box 38, where the isolation trench is disposed between the first memory array and the second memory array. In any of the embodiments herein, the first memory array may comprise an array of a vertical 3D NAND strings of memory cells at box 39, and the memory cells comprise one of floating gate NAND memory cells, CTF NAND memory cells, and isolated CTF NAND memory cells at box 40. Those skilled in the art will appreciate that the order of the various boxes in the method 30 does not necessarily occur from top to bottom as illustrated in FIG. 3. Rather, the boxes of the method 30 may occur in any practical order depending on the particular manufacturing process.

Some embodiments may advantageously provide technology for 3D NAND flash IO pin capacitance reduction. Some 3D NAND memory devices may have array layers processed on top of CMOS circuitry and followed by a tall contact/backend metal layer. Data from a peripheral interface flows in/out of a backend tall metal contact to the CMOS circuitry to store/retrieve the data into/from memory array. This tall contact has a high capacitance to the array layers, and limits how fast the data can transfer. Some embodiments may advantageously re-locate the tall contacts for IO pads to go through an isolation ring trench oxide. Other pads/contacts may still go through the array layers. Embodiments reduce or eliminate tall contact to array capacitance and contain total IO capacitance only to the CMOS circuitry. Advantageously, embodiments may enable higher IO speed for a 3D memory device as compared to a device with all or more of the tall contacts for IO pads that go through the array layers.

Figure 4:
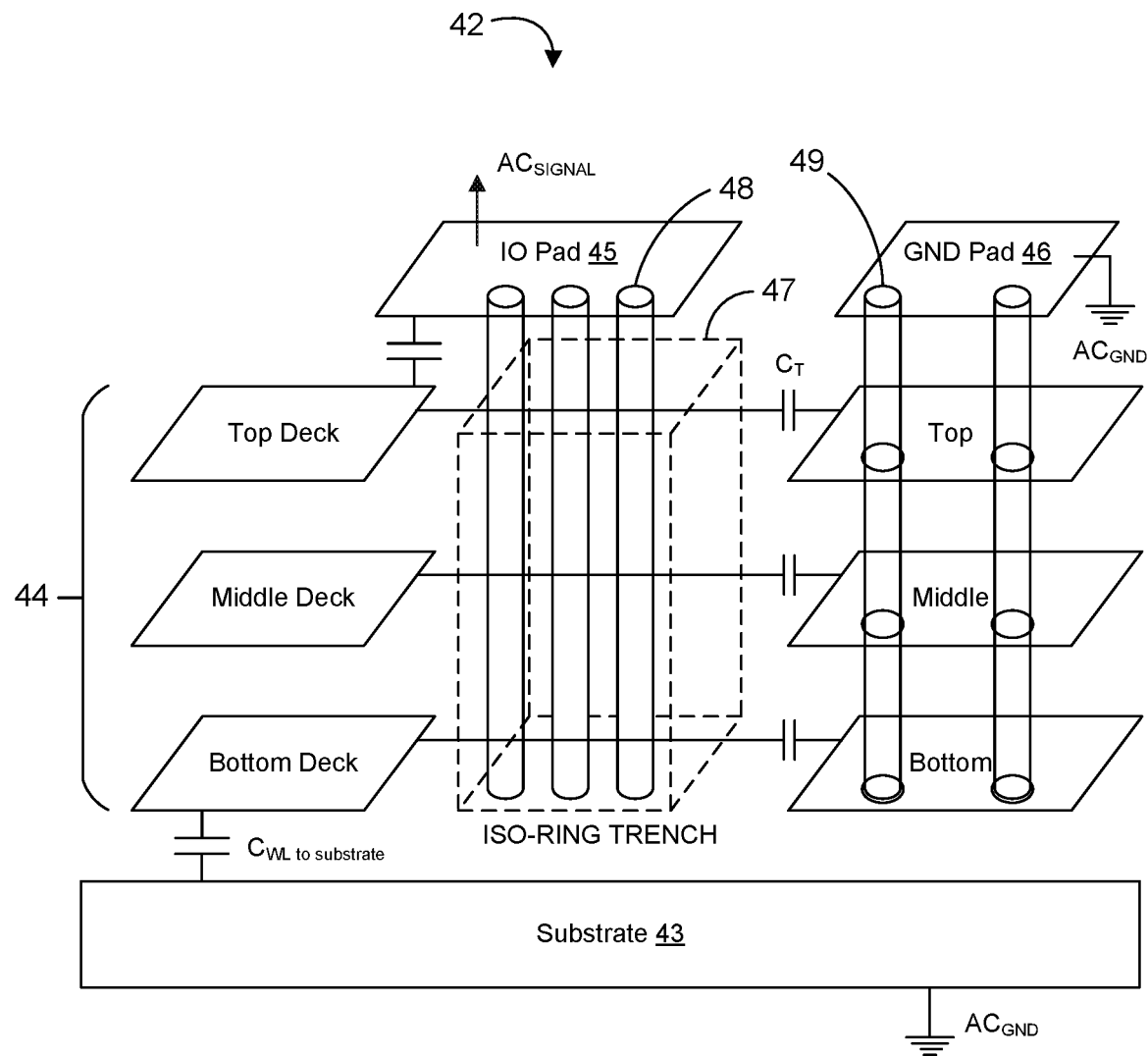
FIG. 4 is a block diagram, exploded perspective view of another example of a memory device according to an embodiment.

With reference to FIG. 4, a memory device 42 includes a substrate 43 with one or more memory arrays 44 disposed on the substrate 43. The memory array(s) 44 have a top deck, a middle deck, and a bottom deck. The memory device 42 further includes one or more IO pads 45 and non-IO pads 46 (e.g., a ground pad). An isolation trench 47 is further disposed adjacent to a memory array 44 (e.g., between two memory arrays 44). For example, the isolation trench 47 may completely surround a memory array 44 as an isolation ring (iso-ring). In some conventional devices, all of the tall contacts go through the layers of the memory array 44. As the number of layers increases, the capacitance between the tall contacts and the memory array 44 becomes a problem, particularly with respect to performance. Some embodiments may have one or more tall contacts 48 in the IO pad(s) 45 go through the iso-ring oxide and the remaining tall contacts 49 in non-IO pad(s) 46 still go through the array layers with a thinner surround of an oxide/nitride layer. As shown in FIG. 4, the tall contacts 48 and 49 span each of the top, middle, and bottom decks. Advantageously, having the tall contacts 48 go through the isolation trench 47 eliminates capacitance from the tall contacts 48 to the array layers and limits IO pin capacitance only to CMOS plus interconnect capacitance.

Figure 5A:
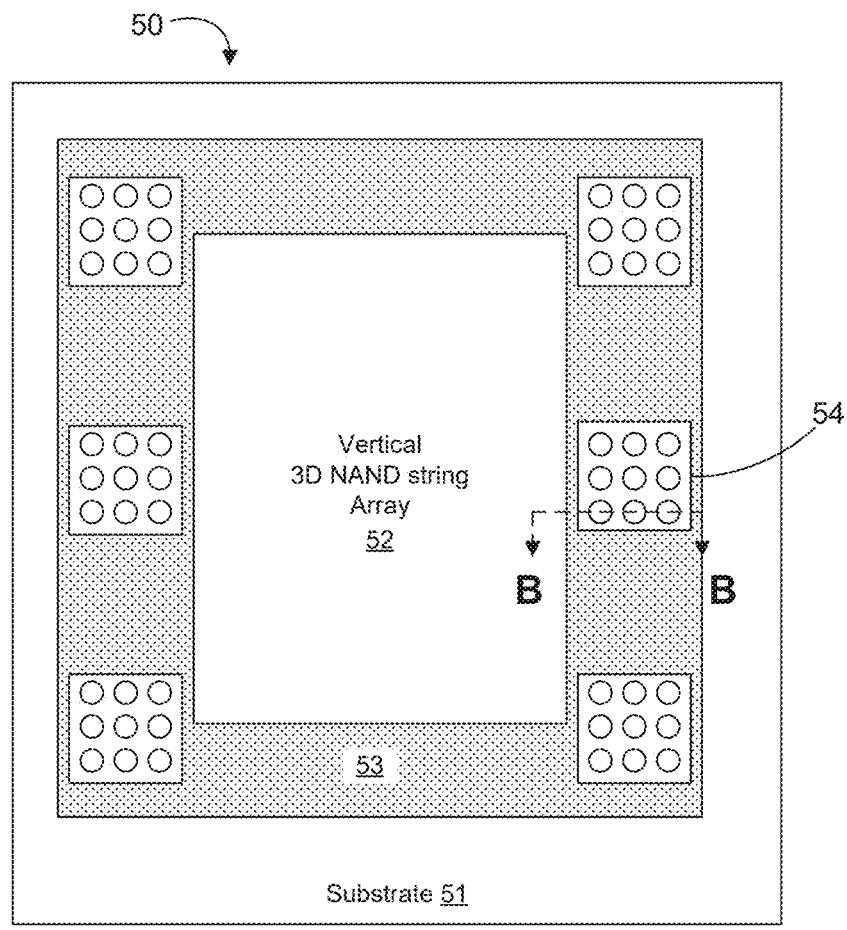
FIG. 5A is an illustrative top view of another example of a memory device according to an embodiment.
Figure 5B:
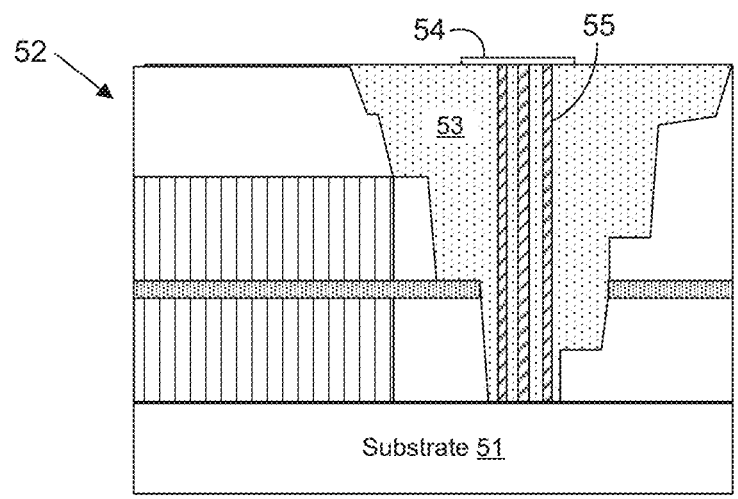
FIG. 5B is an illustrative side cross sectional view taken along line B-B in FIG. 5A.

With reference to FIGS. 5A to 5B, an embodiment of a memory device 50 includes a substrate 51 with one or more arrays 52 of vertical 3D NAND strings disposed on the substrate 51. An iso-ring 53 surrounds at least one of the memory arrays. IO pads 54 are located in the iso-ring 53 with tall contacts 55 that go through the oxide of the iso-ring 53. Advantageously, having the tall contacts 55 go through the isolation trench 53 eliminates capacitance from the tall contacts 55 to the array layers and limits IO pin capacitance only to CMOS plus interconnect capacitance.

The technology discussed herein may be provided in various computing systems (e.g., including a non-mobile computing device such as a desktop, workstation, server, rack system, etc., a mobile computing device such as a smartphone, tablet, Ultra-Mobile Personal Computer (UMPC), laptop computer, ULTRABOOK computing device, smart watch, smart glasses, smart bracelet, etc., and/or a client/edge device such as an Internet-of-Things (IoT) device (e.g., a sensor, a camera, etc.)).

Figure 6:
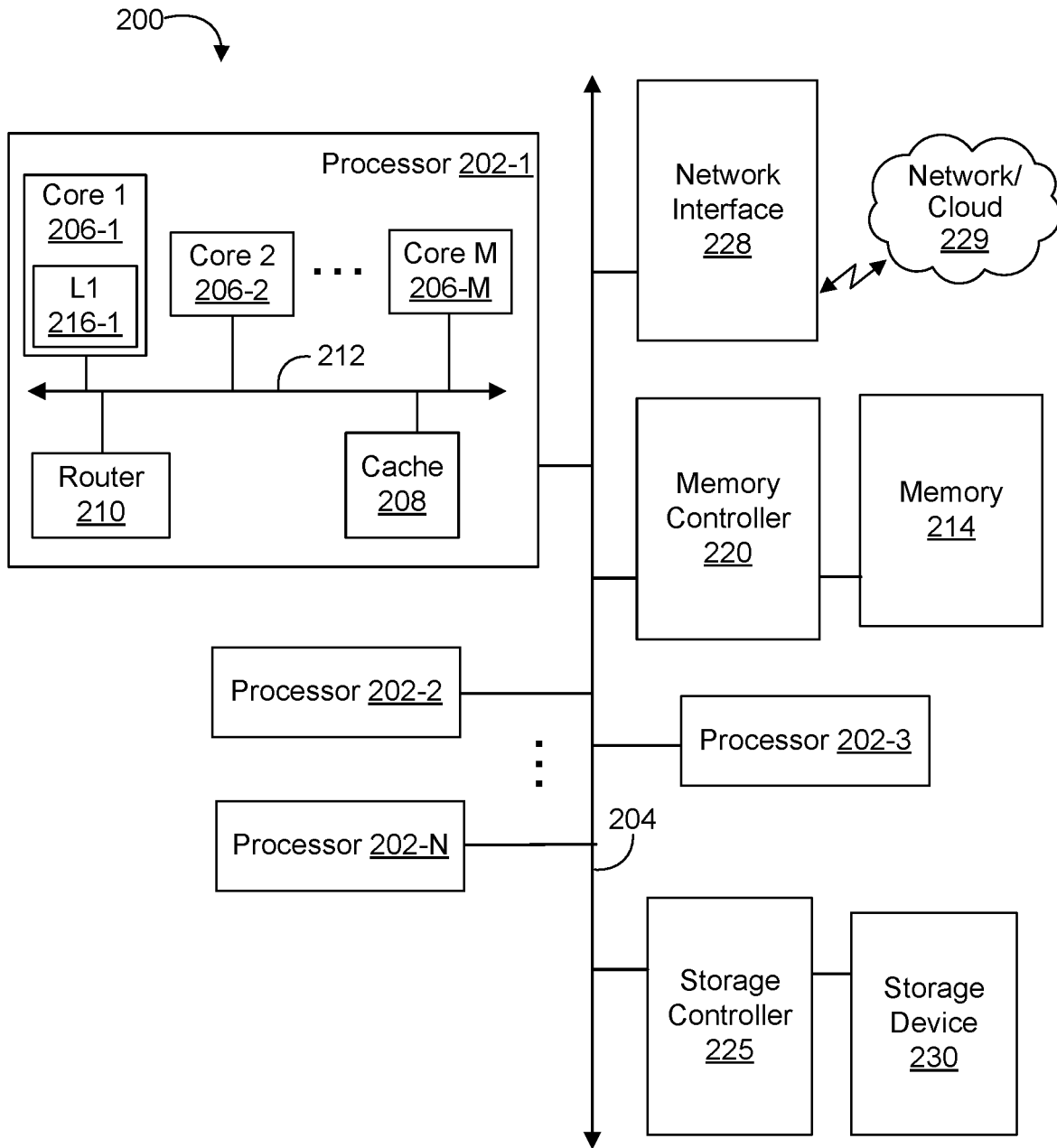
FIG. 6 is a block diagram of an example of a computing system according to an embodiment.

Turning now to FIG. 6, an embodiment of a computing system 200 may include one or more processors 202-1 through 202-N (generally referred to herein as "processors 202" or "processor 202"). The processors 202 may communicate via an interconnection or bus 204. Each processor 202 may include various components some of which are only discussed with reference to processor 202-1 for clarity. Accordingly, each of the remaining processors 202-2 through 202-N may include the same or similar components discussed with reference to the processor 202-1.

In some embodiments, the processor 202-1 may include one or more processor cores 206-1 through 206-M (referred to herein as "cores 206," or more generally as "core 206"), a cache 208 (which may be a shared cache or a private cache in various embodiments), and/or a router 210. The processor cores 206 may be implemented on a single integrated circuit (IC) chip. Moreover, the chip may include one or more shared and/or private caches (such as cache 208), buses or interconnections (such as a bus or interconnection 212), memory controllers, or other components.

In some embodiments, the router 210 may be used to communicate between various components of the processor 202-1 and/or system 200. Moreover, the processor 202-1 may include more than one router 210. Furthermore, the multitude of routers 210 may be in communication to enable data routing between various components inside or outside of the processor 202-1.

The cache 208 may store data (e.g., including instructions) that is utilized by one or more components of the processor 202-1, such as the cores 206. For example, the cache 208 may locally cache data stored in a memory 214 for faster access by the components of the processor 202. As shown in FIG. 6, the memory 214 may be in communication with the processors 202 via the interconnection 204. In some embodiments, the cache 208 (that may be shared) may have various levels, for example, the cache 208 may be a mid-level cache and/or a last-level cache (LLC). Also, each of the cores 206 may include a level 1 (L1) cache (216-1) (generally referred to herein as "L1 cache 216"). Various components of the processor 202-1 may communicate with the cache 208 directly, through a bus (e.g., the bus 212), and/or a memory controller or hub.

As shown in FIG. 6, memory 214 may be coupled to other components of system 200 through a memory controller 220. Memory 214 may include volatile memory and may be interchangeably referred to as main memory or system memory. Even though the memory controller 220 is shown to be coupled between the interconnection 204 and the memory 214, the memory controller 220 may be located elsewhere in system 200. For example, memory controller 220 or portions of it may be provided within one of the processors 202 in some embodiments. Alternatively, memory 214 may include byte-addressable non-volatile memory such as INTEL OPTANE technology.

The system 200 may communicate with other devices/systems/networks via a network interface 228 (e.g., which is in communication with a computer network and/or the cloud 229 via a wired or wireless interface). For example, the network interface 228 may include an antenna (not shown) to wirelessly (e.g., via an Institute of Electrical and Electronics Engineers (IEEE) 802.11 interface (including IEEE 802.11a/b/g/n/ac, etc.), cellular interface, 3G, 4G, LTE, BLUETOOTH™, etc.) communicate with the network/cloud 229.

System 200 may also include a storage device such as a storage device 230 coupled to the interconnect 204 via storage controller 225. Hence, storage controller 225 may control access by various components of system 200 to the storage device 230. Furthermore, even though storage controller 225 is shown to be directly coupled to the interconnection 204 in FIG. 6, storage controller 225 can alternatively communicate via a storage bus/interconnect (such as the SATA (Serial Advanced Technology Attachment) bus, Peripheral Component Interconnect (PCI) (or PCI EXPRESS (PCIe) interface), NVM EXPRESS (NVMe), Serial Attached SCSI (SAS), Fiber Channel, etc.) with one or more other components of system 200 (for example where the storage bus is coupled to interconnect 204 via some other logic like a bus bridge, chipset, etc.) Additionally, storage controller 225 may be incorporated into memory controller logic or provided on a same integrated circuit (IC) device in various embodiments (e.g., on the same circuit board device as the storage device 230 or in the same enclosure as the storage device 230).

Furthermore, storage controller 225 and/or storage device 230 may be coupled to one or more sensors (not shown) to receive information (e.g., in the form of one or more bits or signals) to indicate the status of or values detected by the one or more sensors. These sensor(s) may be provided proximate to components of system 200 (or other computing systems discussed herein), including the cores 206, interconnections 204 or 212, components outside of the processor 202, storage device 230, SSD bus, SATA bus, storage controller 225, etc., to sense variations in various factors affecting power/thermal behavior of the system/platform, such as temperature, operating frequency, operating voltage, power consumption, and/or inter-core communication activity, etc.

Any of the memory and/or storage devices in the system 200 may include the 3D NAND memory with IO contacts located in isolation tranches, as described herein.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C. Various components of the systems described herein may be implemented in software, firmware, and/or hardware and/or any combination thereof. For example, various components of the systems or devices discussed herein may be provided, at least in part, by hardware of a computing SoC such as may be found in a computing system such as, for example, a smart phone. Those skilled in the art may recognize that systems described herein may include additional components that have not been depicted in the corresponding figures. For example, the systems discussed herein may include additional components such as bit stream multiplexer or de-multiplexer modules and the like that have not been depicted in the interest of clarity.

While implementation of the example processes discussed herein may include the undertaking of all operations shown in the order illustrated, the present disclosure is not limited in this regard and, in various examples, implementation of the example processes herein may include only a subset of the operations shown, operations performed in a different order than illustrated, or additional operations.

In addition, any one or more of the operations discussed herein may be undertaken in response to instructions provided by one or more computer program products. Such program products may include signal bearing media providing instructions that, when executed by, for example, a processor, may provide the functionality described herein. The computer program products may be provided in any form of one or more machine-readable media. Thus, for example, a processor including one or more graphics processing unit(s) or processor core(s) may undertake one or more of the blocks of the example processes herein in response to program code and/or instructions or instruction sets conveyed to the processor by one or more machine-readable media. In general, a machine-readable medium may convey software in the form of program code and/or instructions or instruction sets that may cause any of the devices and/or systems described herein to implement at least portions of the operations discussed herein and/or any portions the devices, systems, or any module or component as discussed herein.

As used in any implementation described herein, the term "module" refers to any combination of software logic, firmware logic, hardware logic, and/or circuitry configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, fixed function circuitry, execution unit circuitry, and/or firmware that stores instructions executed by programmable circuitry. The modules may, collectively or individually, be embodied as circuitry that forms part of a larger system, for example, an integrated circuit (IC), system on-chip (SoC), and so forth.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as IP cores may be stored on a tangible, machine readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments are not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. A memory device, comprising:
a first memory array of three-dimensional (3D) NAND cells over a substrate, wherein the first memory array comprises a plurality of decks arranged vertically;
an isolation trench comprising an oxide material, wherein the isolation trench is formed over the substrate and located adjacent to the first memory array, and separates the first memory array from a distinct second memory array of 3D NAND cells over the substrate;
an input/output (IO) contact within the monolithic oxide material of the isolation trench and spanning at least two decks of the plurality of decks;
an IO pad on the oxide material of the isolation trench, wherein the IO contact extends from the IO pad to the substrate;
a non-IO contact that spans at least two decks of the plurality of decks in an area of the first memory array and goes through one or more array layers with a thinner surround of a dielectric layer; and
a ground pad laterally adjacent to the IO pad and coupled to the non-IO contact;
wherein the isolation trench completely surrounds the first memory array.

2. The memory device of claim 1, wherein the isolation trench is immediately adjacent to the second memory array.

3. The memory device of claim 1, wherein the first memory array comprises an array of a vertical 3D NAND strings of memory cells.

4. The memory device of claim 3, wherein the memory cells comprise one of floating gate NAND memory cells, charge trap flash (CTF) NAND memory cells, and isolated CTF NAND memory cells.

5. The memory device of claim 1, further comprising:
a second IO contact within the monolithic material of the isolation trench extending from the IO pad to the substrate.

6. The memory device of claim 1, further comprising:
a processor coupled to memory comprising the first memory array, the isolation trench, the IO contact, the IO pad, the non-IO contact, and the ground pad.

7. The memory device of claim 6, further comprising:
at least one of a display or a battery coupled to the processor.

8. A memory device, comprising:
a first memory array of three-dimensional (3D) NAND cells over a substrate, wherein the first memory array comprises a plurality of decks arranged vertically;
an isolation trench further including an oxide material, wherein the isolation trench is formed over the substrate and located adjacent to the first memory array, and separates the first memory array from a distinct second memory array of 3D NAND cells over the substrate;
an input/output (IO) contact within the isolation trench and spanning at least two decks of the plurality of decks;
an IO pad on the isolation trench, wherein the IO contact extends from the IO pad to the substrate;
a non-IO contact that spans at least two decks of the plurality of decks in an area of the first memory array and goes through one or more array layers with a thinner surround of a dielectric layer; and
a ground pad laterally adjacent to the IO pad and coupled to the non-IO contact;
wherein the isolation trench completely surrounds the first memory array.

9. The memory device of claim 8, further comprising: a second memory array of 3D NAND cells over the substrate, wherein the isolation trench is between the first memory array and the second memory array.

10. The memory device of claim 8, wherein the first memory array comprises an array of a vertical 3D NAND strings of memory cells.

11. The memory device of claim 10, wherein the memory cells comprise one of floating gate NAND memory cells, charge trap flash (CTF) NAND memory cells, and isolated CTF NAND memory cells.

12. The memory device of claim 8, further comprising:
a second IO contact within the isolation trench extending from the IO pad to the substrate.

13. The memory device of claim 8, further comprising:
a processor coupled to memory comprising the first memory array, the isolation trench, the IO contact, the IO pad, the non-IO contact, and the ground pad.

14. The memory device of claim 13, further comprising:
at least one of a display or a battery coupled to the processor.

* * * * *